United States Patent
Regier et al.

(10) Patent No.: US 8,456,338 B2
(45) Date of Patent: Jun. 4, 2013

(54) COMPLIANCE METHODS FOR SOURCE MEASURE UNITS OPERATING WITH DIGITAL CONTROL LOOPS

(75) Inventors: Christopher G. Regier, Cedar Park, TX (US); L. Rolando Ortega-Pohlenz, Austin, TX (US)

(73) Assignee: National Instruments Corporation, Austin, TX (US)

( * ) Notice: Subject to any disclaimer, the term of this patent is extended or adjusted under 35 U.S.C. 154(b) by 189 days.

(21) Appl. No.: 13/154,266

(22) Filed: Jun. 6, 2011

(65) Prior Publication Data

US 2012/0306559 A1 Dec. 6, 2012

(51) Int. Cl.
*H03M 1/00* (2006.01)

(52) U.S. Cl.
USPC .............. 341/142; 341/144; 702/60; 702/64

(58) Field of Classification Search
USPC .............................. 341/142, 144; 702/60, 64
See application file for complete search history.

(56) References Cited

U.S. PATENT DOCUMENTS

| | | | |
|---|---|---|---|
| 5,579,236 A | | 11/1996 | Tamamura et al. |
| 5,754,041 A | | 5/1998 | Kaito et al. |
| 5,959,463 A | * | 9/1999 | Funakura et al. ........ 324/762.01 |
| 5,970,074 A | | 10/1999 | Ehiro |
| 6,087,843 A | * | 7/2000 | Pun et al. ................. 324/762.02 |
| 7,502,697 B2 | | 3/2009 | Holmquist et al. |
| 7,903,008 B2 | | 3/2011 | Regier |
| 2009/0015221 A1 | | 1/2009 | Kodera |

OTHER PUBLICATIONS

"NI PXIe-4154: Battery Simulator Optimized for Mobile Device Test," National Instruments Corporation, Oct. 11, 2010, 4 pages.

* cited by examiner

*Primary Examiner* — Khai M Nguyen
(74) *Attorney, Agent, or Firm* — Meyertons Hood Kivlin Kowert & Goetzel, P.C.; Jeffrey C. Hood

(57) ABSTRACT

A source-measure unit (SMU) may be implemented with respective digital control loops for output voltage and output current. The digital control loop associated with the output that is being regulated may be the setpoint control loop while the digital control loop associated with the other output may be the compliance control loop. The digital loop controller may switch between the setpoint control loop and the compliance control loop without generating a mode-change glitch, by maintaining a single integrator. The compliance methods may differ in how and when the decision is made to select which of the measured signals provides the error signal to the integrator. Thus, there may be no issue with integrator wind-up, which might be the case if there were two complete control loops operating continuously.

23 Claims, 3 Drawing Sheets

COMPLIANCE METHODS FOR SOURCE MEASURE UNITS OPERATING WITH DIGITAL CONTROL LOOPS

INCORPORATION BY REFERENCE

U.S. Pat. No. 7,903,008 B2 is hereby incorporated by reference as though fully and completely set forth herein.

BACKGROUND OF THE INVENTION

1. Field of the Invention

This invention relates generally to measurement and data acquisition systems and, more particularly, to the design of digital source-measure units.

2. Description of the Related Art

Scientists and engineers often use measurement systems to perform a variety of functions, including measurement of a physical phenomena a unit under test (UUT) or device under test (DUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others. Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications. DAQ devices may also include a Source-Measure Unit (SMU), which may apply a voltage to a DUT and measure the resulting current, or may apply a current to the DUT and measure the resulting voltage. SMUs are typically configured to operate according to what is commonly referred to as "compliance limits", to limit the output current when sourcing voltage, and to limit the output voltage when sourcing current. In other words, a compliance limit on the measured signal may determine the (maximum) value of the sourced signal. For example, when applying a source voltage to a DUT and measuring current, a given current value (e.g. 1 A) specified as the compliance limit would determine the (maximum) input (source) voltage that might be provided to the DUT. In most cases compliance limits may depend and/or may be determined based on the DUTs, e.g. the maximum (absolute) value of the current that may flow into the DUT, or the maximum (absolute) value of the voltage that may be applied across the terminals of the DUT.

In the case of most SMUs, the setpoint (the desired output voltage when sourcing and regulating voltage, or the desired current value when sourcing and regulating current) and the compliance limits are typically programmable. SMUs are available to cover a variety of signal levels, from the microvolt ($\mu$V) range to the kilovolt (kV) range, and from the femtoampere (fA) range to the ampere (A) range. Some SMUs can deliver or dissipate significant power, while other SMUs may be operated at low power. The accuracy of SMUs is typically less than the accuracy of high-quality calibrators and/or digital multi meters (DMMs).

For quite a while, SMUs were implemented with precision digital-to-analog converters (DACs) used for programming the setpoint and compliance limits into an analog control loop. The output voltage across the output terminals of the SMU, or the output current flowing into the output terminal of the SMU were typically set using the analog control loops by comparing the outputs to the levels set by the DACs. Each output voltage or output current could be controlled separately, with only one of the analog control loops closed at any given time. Voltage values representative of current and voltage measurements were provided to an analog-to-digital (ADC) element. In some SMUs, separate ADCs (instead of a single ADC) were used to read the analog output voltage or the analog output current. These SMUs were generally limited in flexibility and high in complexity, resulting from requirements to minimize glitches during range switching. In order for the SMU to operate accurately, a high level of accuracy was required for the DACs and ADCs configured in the SMU.

A more recent trend has been to implement SMUs with a control loop configured in the digital domain. The output voltage and output current in such a configuration is measured with dedicated ADCs. When sourcing current, the current readings obtained by the ADCs are compared to a Current Setpoint, and when sourcing voltage, the voltage readings are compared to a Voltage Setpoint, to regulate the current and voltage outputs, respectively. The setpoints can be set, for example, in an FPGA (field programmable gate array) or DSP (digital signal processing) chip. The FPGA or DSP chip can be used accordingly to produce an output to drive a DAC until the output voltage and/or output current reach the respective desired levels. The SMU can be configured to source one type of signal while measuring another type of signal. For example, the SMU can be configured to measure the voltage across the terminals of a device under test (DUT), when sourcing (and regulating) a current to the DUT, and similarly, the SMU can be configured to measure the current flowing into the DUT, when sourcing (and regulating) the voltage applied across the terminals of the DUT.

Overall, SMUs designed with digital control loops offer a number of advantages. However, even in the case of SMUs featuring digital control loops, it is still necessary to determine at which point during regulation the compliance control loops should take over the regulatory functions from the setpoint control loops.

Other corresponding issues related to the prior art will become apparent to one skilled in the art after comparing such prior art with the present invention as described herein.

SUMMARY OF THE INVENTION

In one set of embodiments, the SMU may be configured to check the measured entity (current or voltage) against specified compliance limits, which may effectively limit the magnitude of the sourced signal. The SMU may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit is 5V, if sourcing a 1 A current in the DUT results in a measured voltage that exceeds 5V, the SMU may lower the current to below 1 A until the measured voltage no longer exceeds the allowed 5V. Similarly, if the setpoint for sourcing and regulating voltage is 5V, and the current compliance limit is 1 A, if sourcing a 5V voltage across the terminals of the DUT results in a measured current that exceeds 1 A, the SMU may lower the voltage to below 5V until the measured current no longer exceeds the allowed 1 A.

The readback values (for the measured current and/or voltage) may be obtained by averaging the current and/or voltage values received from analog-to-digital converters (ADCs). The averaging may be weighted to provide noise rejection advantages. Placing the control loop in the digital domain provides added flexibility, and a decrease in the accuracy requirements on the digital-to-analog converter (DAC) used to produce the control signal of the SMU. The digital control loop also offers the possibility of novel approaches for solving potential range-switching issues that may arise within the SMUs.

In one set of embodiments, an SMU may comprise output terminals configured to couple the SMU to a device, and further configured to convey an analog output signal to the device to effect an output current flowing into the device, and an output voltage across input terminals of the device. The SMU may include a first converter configured to generate a first digital value representative of the output current, a second converter configured to generate a second digital value representative of the output voltage, and a digital loop controller configured to receive the first digital value and the second digital value, and generate a digital control signal based on the first digital value and the second digital value to regulate a specified function of the output current and the output voltage to remain at a value corresponding to a setpoint. The specified function may be the output current, the output voltage, power, or resistance, to name a few. The first digital value, being representative of the output current, may correspond to a current measurement, and the second digital value being representative of the output voltage may correspond to a voltage measurement. The first digital value and second digital value may therefore effectively be used in measuring and/or controlling any function, which may be defined and/or processed in the digital loop controller. For example, multiplying the first digital value and the second digital value may provide a measurement of power. Accordingly, the digital control value may be generated by the digital loop controller to effect desired changes in the output current and/or the output voltage depending on what the selected function is. For example, if the selected function is power, then both the output current and output voltage may be regulated, or only one of the output current and output voltage may be regulated based on the measured output current and output voltage.

The digital loop controller may be used to produce a digital control signal to drive the DAC until the output voltage and/or output current and/or a function thereof reach the respective desired levels, according to the respective digital control loops for current and voltage. When regulating for a voltage setpoint with a current compliance limit, the voltage control loop may be considered the setpoint control loop, and the current control loop may be considered the compliance control loop. In contrast, when regulating for a current setpoint with a voltage compliance limit, the current control loop may be considered the setpoint control loop, and the voltage control loop may be considered the compliance control loop. There are typically two compliance limits, an upper limit and a lower limit. For example, for the case of the compliance limit of 1 A mentioned above, the upper limit would be 1 A to keep the SMU from sourcing more than 1 A, while the lower limit could be −1 A to keep the SMU from sinking more than 1 A. Since a digital SMU operates according to a digital control loop rather than an analog control loop, it is desirable to have some means for determining when control should be turned over to the compliance control loop from the setpoint control loop.

In one set of embodiments, an SMU may include output terminals to couple the SMU to a device. The output terminals may be operated to convey an analog output signal to the device, to provide an output voltage across input terminals of the device, and to produce an output current flowing into the device. The SMU may further include a digital loop controller that may receive a first digital value representative of the output current and a second digital value representative of the output voltage. The digital loop controller may selectively regulate either the output voltage or the output current. When selected to regulate for the output current, the digital loop controller may adjust the analog output signal according to the first digital value to keep the output current at a specified current setpoint, until the output voltage reaches a specified voltage compliance limit, and it may adjust the analog output signal according to the second digital value to keep the output voltage from exceeding the specified voltage compliance limit once the output voltage reaches the specified voltage compliance limit. When selected to regulate for the output voltage, the digital loop controller may adjust the analog output signal according to the second digital value to keep the output voltage at a specified voltage setpoint, until the output current reaches a specified current compliance limit, and it may adjust the analog output signal according to the first digital value to keep the output current from exceeding the specified current compliance limit once the output current reaches the specified current compliance limit.

In one embodiment, a digital loop controller includes a first input to receive a first digital value representative of an output voltage developed across input terminals of a device, and further includes a second input to receive a second digital value representative of an output current produced in the device by the output voltage. The digital loop controller may generate a digital control value to adjust the output voltage to selectively regulate for either the output voltage or the output current. When regulating for the output voltage, the digital loop controller may generate the digital control value according to the first digital value to keep the output voltage at a specified voltage setpoint, until the output current reaches a specified current compliance limit, and it may generate the digital control value according to the second digital value to keep the output current from exceeding the specified current compliance limit once the output current reaches the specified current compliance limit. When regulating for the output current, the digital loop controller may generate the digital control value according to the second digital value to keep the output current at a specified current setpoint, until the output voltage reaches a specified voltage compliance limit, and it may generate the digital control value according to the first digital value to keep the output voltage from exceeding the specified voltage compliance limit once the output voltage reaches the specified voltage compliance limit.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
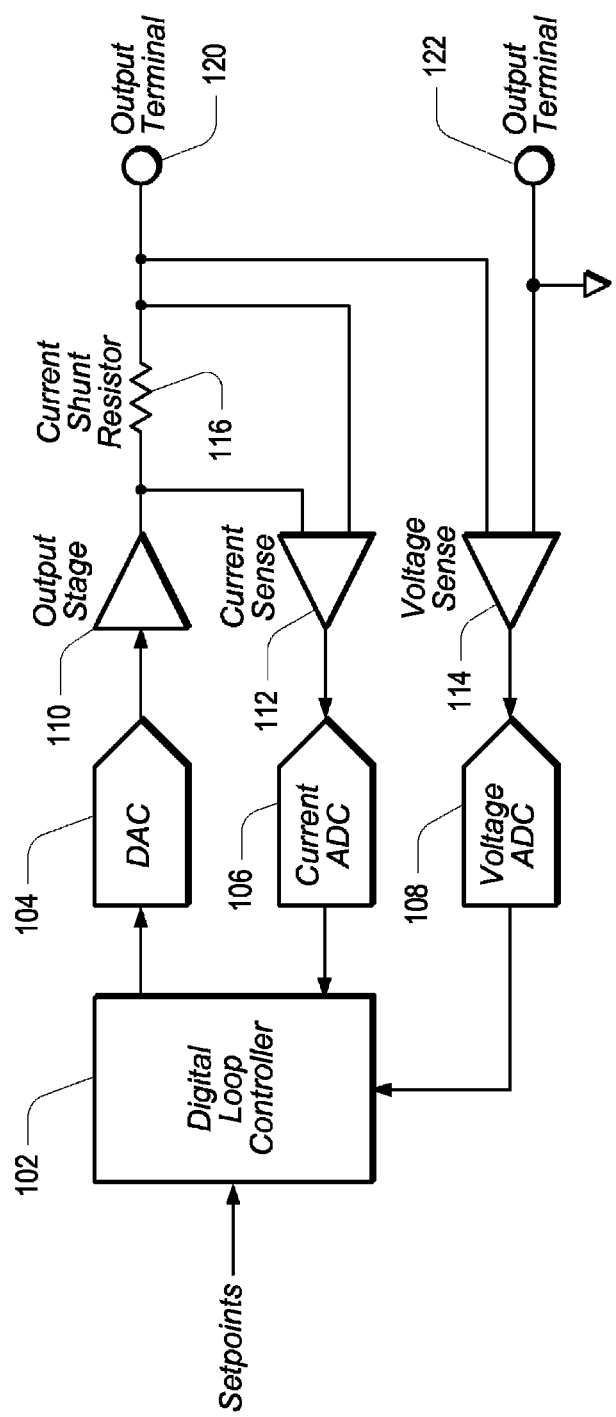
FIG. 1 shows the basic architecture of a prior art SMU featuring digital control loops and a digital loop controller.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

FIG. 1 shows the basic architecture of one embodiment of a prior art SMU (source-measure unit) in which the entire control loop has been configured in the digital domain. A DUT (device under test), not shown, may be coupled between output terminals 120 and 122. Setpoints and compliance limits may be provided (programmed) to Digital Loop Controller (DLC) 102, which may provide a control output through DAC (digital-to-analog converter) 104 to Output Stage 110. Feedback from Output Stage 110 may be provided to Current ADC (analog-to-digital converter) 106 and Voltage ADC 108 via respective Current Sense element 112 and Voltage Sense element 114. The current feedback may be taken from the current flowing through current shunt resistor 116, and the feedback voltage may be taken from across output terminals 120 and 122. Current ADC 106 and Voltage ADC 108 may then provide the readback current and voltage values into DLC 102.

DLC 102 may be configured to check the measured current (from Current ADC 106) resulting from a sourced voltage, against the specified current compliance limit provided (or programmed) into DLC 102. DLC 102 may similarly be configured to check the measured voltage (from Voltage ADC 108) resulting from a sourced current, against the specified voltage compliance limit provided (or programmed) into DLC 102. To regulate the output, DLC 102 may be configured to check the measured current (from Current ADC 106) resulting from a sourced current, against the specified current setpoint provided (or programmed) into DLC 102. DLC 102 may similarly be configured to check the measured voltage (from Voltage ADC 108) resulting from a sourced voltage, against the specified voltage setpoint provided (or programmed) into DLC 102.

The compliance limits may effectively limit the magnitude of the sourced signals. DLC 102 may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit corresponding to a given DUT is 5V, when sourcing a 1 A current in the DUT results in a voltage measurement that exceeds 5V, DLC 102 may operate to lower the value of the sourced current below 1 A, until a sourced current value is reached for which the measured voltage no longer exceeds the allowed 5V. Similarly, if the setpoint for sourcing and regulating voltage is 5V, and the current compliance limit corresponding to a given DUT is 1 A, when sourcing a 5V voltage across the terminals of the DUT results in a current measurement that exceeds 1 A, DCL 102 may operate to lower the value of the sourced voltage below 5V, until a sourced voltage value is reached for which the measured current no longer exceeds the allowed 1 A.

The digital loop controller (e.g. DLC 102) may provide the added flexibility of being able to operate the SMU for different compliance limits, (and being able to program multiple setpoints), without additional components. In addition, the loop bandwidth may easily be adjusted by changing the controller coefficients, and control loop adjustments may be made through measurable and controllable settling times of the signal. The DLC may also be reconfigurable to the desired mode, controlling/generating current, voltage, power, resistance, or voltage with series impedance, which may be valuable in battery simulation applications.

In one set of embodiments, DLC 102 may be implemented with an ASIC, a DSP, an FPGA, or any other suitable digital circuitry configured to perform the designated functions of DLC 102. An FPGA may be preferable for implementations utilizing National Instruments' LabVIEW graphical programming interface to write and simulate the control code. When using an FPGA with LabVIEW, the control code may be deployed and tested through LV-FPGA (LabVIEW FPGA). The control system itself may be designed to emulate a traditional SMU, while allowing users to implement more advanced features by writing their own control algorithm (for example in LV-FPGA when using LabVIEW and an FPGA). Some embodiments may also implement more advanced features such as constant power delivery or sinking, or constant resistance generation. For safety considerations, especially in user-configured situations, the output of DAC 104 may be limited to a safe level, regardless of feedback.

It should also be noted that when trying to regulate power, for example, two ADCs may be required for obtaining the requisite measurements for the power regulation to be performed. One ADC may be required to measure current (e.g. ADC 106) and another ADC may be required to measure voltage (e.g. ADC 108), with the multiplication (to obtain the power value that may be compared to a setpoint) performed digitally, in DLC 102, for example. Thus, certain embodiments, where the sourced and measured entity is the same (e.g. sourcing current and measuring current), may be configured with a single ADC. In one set of embodiments, when only always one entity (e.g. Current or Voltage) is to be measured, one of the ADCs may simply be removed. In another set of embodiments, the output from the Current Sense element and the output of the Voltage Sense element may be input to a multiplexer (not shown in any of the figures), which may be used to select whether sensed voltage or sensed current is to be converted to the digital value provided to the digital loop controller. These embodiments may be useful, for example, in certain applications where compliance limits were unnecessary, and/or the primary functionality was regulation of the output.

Thus, as described above, the digital loop controller may be used to produce a digital control signal to drive the DAC until the output voltage and/or output current and/or a function thereof reach the respective desired levels, according to the respective digital control loops for current and voltage. When regulating for a voltage setpoint with a current compliance limit, the voltage control loop may be operated as the setpoint control loop, and the current control loop may be operated as the compliance control loop. In contrast, when regulating for a current setpoint with a voltage compliance limit, the current control loop may be operated as the setpoint control loop, and the voltage control loop may be operated as the compliance control loop. There may be two compliance limits, an upper limit and a lower limit. For example, for the case of the compliance limit of 1 A described above, the upper limit may be 1 A to keep the SMU from sourcing more than 1 A, while the lower limit may be −1 A to keep the SMU from sinking more than 1 A.

Figure 2:
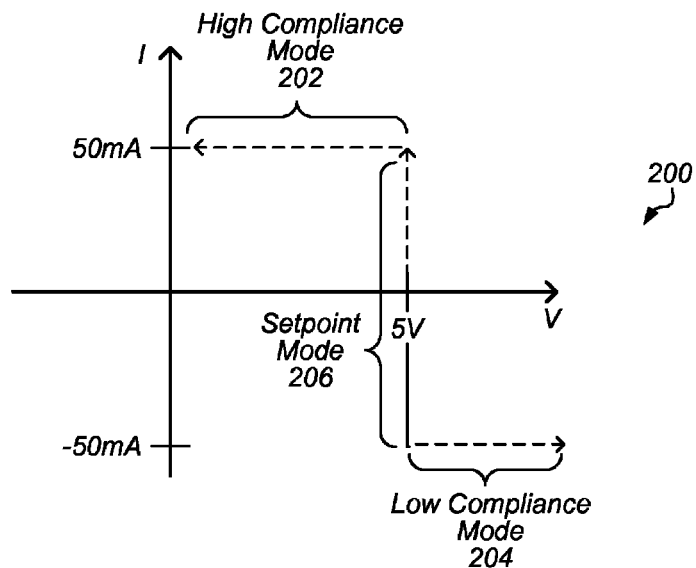
FIG. 2 shows a voltage versus current diagram illustrating three distinct regions of operation for the SMU of FIG. 1.

Accordingly, in one set of embodiments, three distinct regions of operation for the SMU in FIG. 1, and consequently for DLC 102 may be illustrated as shown in diagram 200 of FIG. 2. The load current (I) versus output voltage (V) diagram 200 illustrates the regions of operation for a compliance limit of 50 mA corresponding to a voltage setpoint of 5V, for the purposes of illustration. As seen in FIG. 2, the SMU may be operating in setpoint mode 206 by maintaining the 5V setpoint so long as the 50 mA compliance limit has not been reached. For the case of the SMU sourcing current, the current is indicated as having a positive value. For the case of the SMU sinking current, the current is indicated as having a negative value. If during regulation, the current reaches 50 mA, the SMU may begin operating in high compliance mode 202, in which attempts by the load to draw more current results in a voltage drop, as indicated by the direction of the arrow on the dashed line at the 50 mA mark. Similarly, if during regulation, the current reaches −50 mA, the SMU may begin operating in low compliance mode 204, in which attempts by the SMU to sink more current results in a voltage increase, as indicated by the direction of the arrow on the dashed line at the −50 mA mark.

It should be noted that FIG. 2 shows a negative value for the low compliance limit, but the low compliance limit is in no way restricted to being a negative value. In other words, the low compliance limit is simply indicative of a minimum value for the given parameter, in this case, current, below which the given parameter, in this case current, is not allowed to fall. Furthermore, a compliance limit may not necessarily correspond to a regulated output value that is short of the specified setpoint, that is, a setpoint that is not reached because of the existence of the compliance limit. For example, in some embodiments, voltage may be regulated for a specified setpoint, such as 4V, with a high compliance limit corresponding to a high-end limit of 5V of the regulated output voltage (e.g. with a +5 mA high current compliance limit and a 1 kΩ load), and a low compliance limit corresponding to a low-end limit of 3V of the regulated output voltage (e.g. with a +3 mA low current compliance limit and the 1 kΩ load). As this example illustrates, the low compliance limit and high compliance limit may both be positive values. Similarly, in some other embodiments, both compliance limits may be negative values.

In one set of embodiments, DLC 102 may be configured to switch between the setpoint control loop and the compliance control loop without generating a mode-change glitch, by maintaining a single integrator. The compliance methods may differ in how and when the decision is made to select which of the measured signals provides the error signal to the integrator. Thus there may be no issue with integrator wind-up, which might be the case if there were two complete control loops operating continuously and independently. In setpoint control mode, the error signal passed to the integrator may be proportional to the difference between the setpoint and the measurement to which the setpoint corresponds (e.g. the voltage measurement, if the setpoint is a voltage). In compliance control mode, the error signal may be proportional to the difference between the selected compliance limit and the measurement to which that compliance limit corresponds (e.g. the current measurement, if the compliance limit is a current). In one set of embodiments, once the compliance limit has been reached, operation of the SMU may switch over to the appropriate compliance mode from setpoint mode.

One compliance mode that may be used when switching over from setpoint control to compliance control is referred to herein as "hard compliance." According to hard compliance control, the SMU may remain in setpoint control mode until a compliance limit is exceeded, as determined by the continuously measured compliance parameter, which may be voltage or current, whichever is applicable. Once that compliance limit is exceeded, the device (SMU) may switch to compliance control mode, and remain there until the setpoint is exceeded, at which point it may switch back to setpoint control mode.

Figure 3:
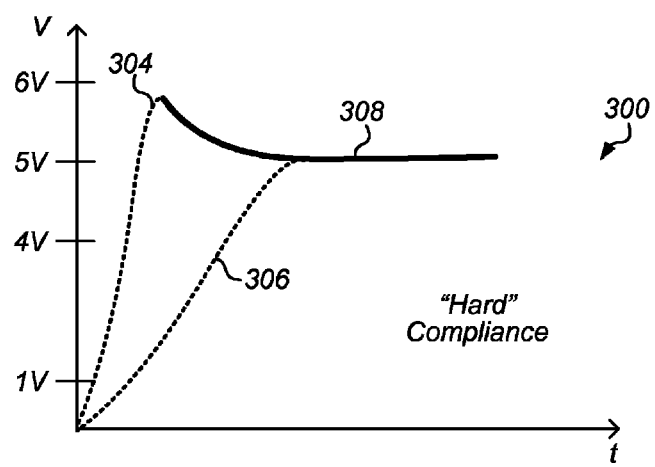
FIG. 3 shows a voltage diagram illustrating possible behavior of the output voltage of the SMU of FIG. 1 when regulating for the output voltage, employing hard compliance control.

FIG. 3 shows a voltage diagram 300 illustrating possible behavior of the output voltage when regulating for the output voltage, that is, having a setpoint for the output voltage, and having a compliance limit for the output current, highlighting hard compliance control. The principles illustrated in FIG. 3 equally apply to the possible behavior of the output current when regulating for the output current, that is, having a setpoint for the output current, and having a compliance limit for the output voltage. As shown in diagram 300, a specific setpoint may be specified for the output voltage, and a compliance limit for the current flowing through shunt element 116 (thus associated with/representative of the output current). It should be noted here, as a reminder, that the actual relationship between the output voltage and output current is primarily determined by the DUT. Diagram 300 is illustrative of the behavior of the output voltage when employing hard compliance mode of regulation for the compliance control loop.

Curve 306 is indicative of the voltage steadily rising to 5V, when the voltage setpoint is 5V, and the compliance limit for the current is not reached as the output voltage reaches the setpoint of 5V. Once 5V is reached, the output voltage settles at 5V, as indicated by curve 308. In this case, regulation may take place through the setpoint control loop, without the compliance control loop being engaged. In contrast, curve 304 is indicative of the voltage attempting to rise (step) to 10V, when the voltage setpoint is 10V, and the compliance limit for the current is reached before the output voltage reaches the setpoint of 10V. Specifically, due the value of the load, the current compliance limit may be reached when the output voltage of the SMU reaches 5V, and attempts at raising the voltage above the 5V level to the desired 10V setpoint may not result in additional current. Therefore, the voltage may sharply level off after peaking around the 6V mark, subsequently following curve 308. Curve 304 is indicative of the voltage stepping to 10V, and, though the current compliance limit may be reached at around 5V, the voltage will briefly exceed 5V, indicating that the current compliance limit is exceeded, before the compliance loop control can bring the voltage back to follow curve 308. As seen in diagram 300, the actual setpoint of 10V is not reached. In this case, the setpoint control loop may be regulating the voltage as curve 304 reaches its peak, but as the voltage begins to drop down, the compliance control may seize control to avoid an output voltage that results in the current compliance limit being exceeded.

It should also be noted that control may be returned to the setpoint control loop in the event the regulated output moves past the setpoint under control of the compliance control loop, that is, in the event the regulated output exceeds the setpoint in case of a high compliance limit, or falls below the setpoint in case of a low compliance limit.

Another compliance mode that may be used when switching over from setpoint control to compliance control is referred to herein as "soft compliance." Various embodiments of soft compliance control methods take into account how far the presently regulated parameter is from the specified setpoint (or target value, which may be the output voltage or the output current, depending on which value is regulated), and how far the other parameter (which is the output current when regulating for the output voltage, and the output voltage when regulating for the output current) is from the compliance limit. To reiterate, when operating in current mode, a current setpoint and voltage compliance limit may be specified, and when operating in voltage mode, a voltage setpoint and current compliance limit may be specified. Therefore, according to soft compliance control, the SMU may compute error signals for the setpoint and both compliance limits. The error signal provided to the controller, which may include an integrator in one embodiment, may be the setpoint error signal bounded by the compliance limit error signals. Thus the integrator may receive an error signal that is no more positive than what would move it toward the upper compliance limit and no lower than what would move it toward the lower compliance limit.

Figure 4:
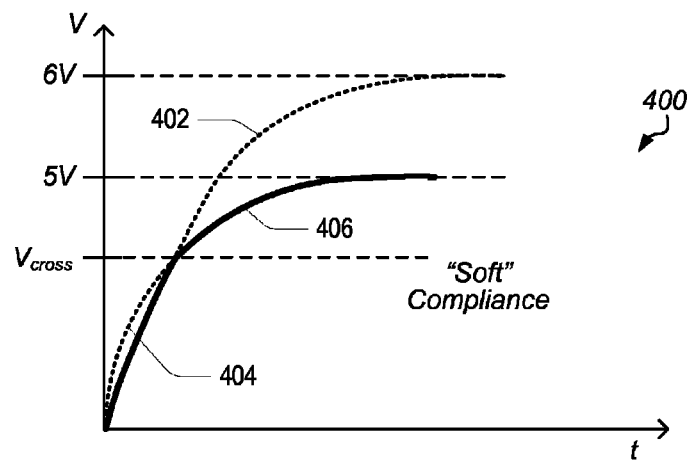
FIG. 4 a voltage diagram illustrating possible behavior of the output voltage of the SMU of FIG. 1 when regulating for the output voltage, employing soft compliance control.

FIG. 4 shows a voltage diagram 400 illustrating possible behavior of the output voltage when regulating for the output voltage, that is, having a setpoint for the output voltage, and having a compliance limit for the output current, highlighting soft compliance control. Again, the principles illustrated in FIG. 4 equally apply to the possible behavior of the output current when regulating for the output current, that is, having a setpoint for the output current, and having a compliance limit for the output voltage. As shown in diagram 400, a specific setpoint may again be specified for the output voltage, and a compliance limit for the current flowing through shunt element 116 (thus associated with/representative of the output current). Again, the actual relationship between the output voltage and output current is primarily determined by the DUT. Diagram 400 is illustrative of the behavior of the output voltage when employing soft compliance mode of regulation for the compliance control loop. As will also be explained further below, diagram 400 is not meant to provide a literal rendering of the output voltage change that might occur in actual SMU implementations, but as an illustration of the principles of soft compliance methods disclosed herein.

Referring now to diagram 400, curve 402 (starting at the origin) is indicative of the voltage steadily rising to 6V, when the voltage setpoint is 6V, and the compliance limit for the current is not reached as the output voltage reaches the setpoint of 6V. Once 6V is reached, the output voltage settles at 6V, and remains there. In this case, regulation may take place through the setpoint control loop, without the compliance control loop being engaged. Curve 404, on the other hand, is indicative of the output voltage rising to 5V as it would if it were regulated from the onset via the compliance control loop. As indicated, the output voltage doesn't rise to 6V as a result of the current compliance limit being reached before the output voltage rises to 6V. Specifically, in the example provided in FIG. 4, the current compliance limit is reached at the 5V mark, and the output voltage remains there under control of the compliance control loop.

As indicated above, a soft compliance method may include the SMU using the error signal that is no more positive than what would move it toward the upper compliance limit and no lower than what would move it toward the lower compliance limit. Accordingly, actual control of the SMU may result in the output voltage tracking black curve 406 in diagram 400. That is, the output voltage may remain under setpoint control, as curve 402 initially represents a more conservative change in voltage (i.e. not as steep as the change represented by curve 404). However, past the crossover point $V_{Cross}$, curve 404 represents a more conservative change in voltage, and control of the SMU may be turned over to the compliance control loop at that point. In this manner, while the output voltage is controlled through the setpoint control loop initially, control may be turned over to the compliance control loop prior to the compliance limit actually having been reached. This is in contrast to the hard compliance control method exemplified by the voltage curves in FIG. 3.

Furthermore, as previously mentioned, the compliance control loop may be operating according to a low compliance mode and/or a high compliance mode, corresponding to minimum and/or maximum compliance limits. Under control of the compliance control loop, a low compliance target value may correspond to the least change of the regulated output value (depending on GBWs), and the change may be in the same direction as a change that would be effected under control of the setpoint control loop, yet control of the setpoint control loop may still be selected. To put it another way, while in certain cases the selection of the more conservative change may be characterized as a selection of the setpoint error bounded by the compliance errors, more generally, a "more conservative change" may be defined as follows. When the SMU is configured with only a single compliance limit, the compliance limit may be specified as either a high compliance limit or a low compliance limit. If the compliance limit is a high compliance limit, selection of the lower value of the scaled setpoint error value and the scaled compliance error value may produce the more conservative change. If the compliance limit is a low compliance limit, selection of the higher value of the scaled setpoint error value and the scaled compliance error value may produce the more conservative change. When the SMU is configured with two compliance limits, that is, both a high compliance limit and a low compliance limit are specified, selection of the median value of the three scaled error values—specifically, the high compliance error value, low compliance error value, and setpoint error value—may produce the more conservative change.

As indicated above, diagram 400 is meant to convey a basic operating principle of one set of embodiments of soft compliance control. For example, diagram 400 may be interpreted in the following manner, when considering the way that the output voltage is actually controlled. As the output moves along curve 402, a new curve 404 starting at the point labeled $V_{Cross}$ is virtually generated. Curve 406 (representative of the actual control) follows curve 404 when the slope of curve 406 starting from the crossover point ($V_{Cross}$) is less steep than the slope of curve 402. So, in actuality, there may be no sudden change of slope such as what appears in illustrated curve 406. To put it another way, it may be very difficult to precisely illustrate the exact behavior of the voltage output during soft compliance control. It should be noted that there may be no preplanned path toward a "clean switch" from setpoint control to compliance control, which the digital loop controller 102 may simply follow when employing soft compliance control. From any given point, the controller may decide to move in a certain direction and, though the expected behavior may be for the points (representing values of the output voltage, in this case) to trace an exponential curve, that behavior may not be applicable when different points in the curve can be determined by different controllers (the setpoint control loop and compliance control loop, for example). For example, in actuality, curve 404 may not be steeper than curve 402 at the onset. The curves illustrated in diagram 400 are, however, possible, but may not be representative of the actual curves, which may be difficult to model in the presence of various random constraints and the possibility of poles and zeros.

In the context of FIG. 4, the magnitude of the error signals may take into account the programmed gain-bandwidth product (GBW) for the relevant mode, since in case of an integrator representing the primary controller function, the amount that the integrator output moves may be proportional to the bandwidth. If a given error-signal "$\epsilon$" results in the integrator moving by "$\Delta V$" volts with a given GBW, it may move by twice that amount, that is, $2*\Delta V$ if GBW is doubled. Since one goal of soft compliance may be to move the integrator output in the most conservative fashion, the setpoint and high and low compliance error signals (the setpoint error signal referred to as "$\epsilon_S$", the high compliance error signal referred to as "$\epsilon_{CH}$", and the low compliance error signal referred to as "$\epsilon_{CL}$") may all be multiplied by their respective GBWs before deciding which one should take control of the SMU (i.e. of the integrator function, in this case). Alternatively, the compliance errors may be left unmodified, while the setpoint error may be multiplied by the ratio of the setpoint GBW to the compliance GBW. The selected error signal may then be multiplied by the compliance GBW before being accumulated by the integrator.

Figure 5:
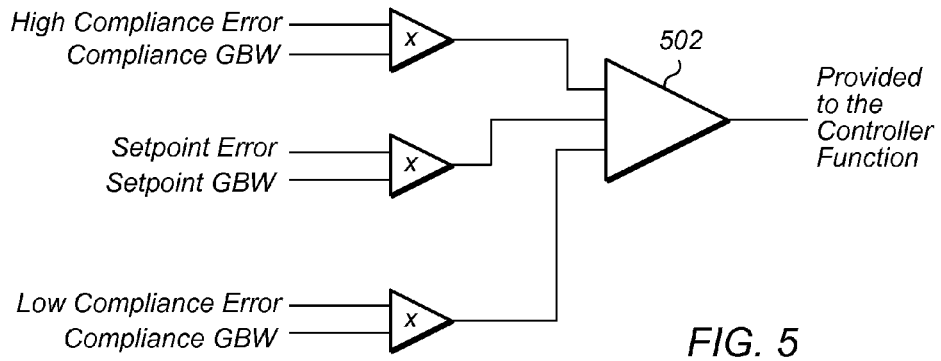
FIG. 5 shows a logic diagram of how the error signal for regulating an output voltage or current is selected according to a first embodiment of soft compliance control implemented by the SMU of FIG. 1.
Figure 6:
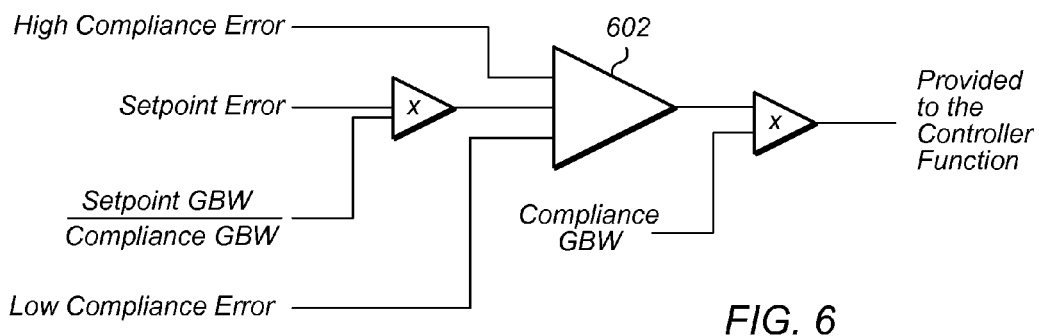
FIG. 6 shows a logic diagram of how the error signal for regulating an output voltage or current is selected according to a second embodiment of soft compliance control implemented by the SMU of FIG. 1.
Figure 7:
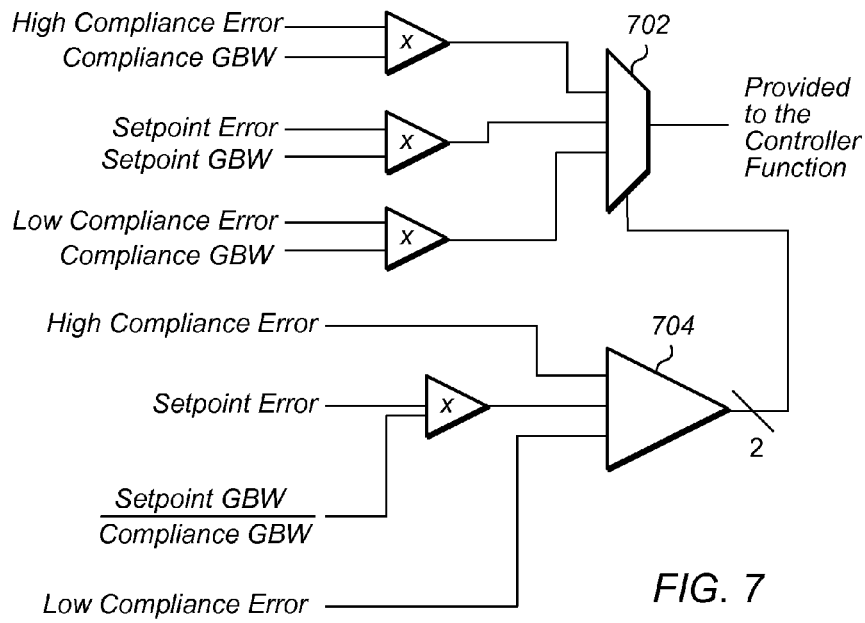
FIG. 7 shows a logic diagram of how the error signal for regulating an output voltage or current is selected according to a third embodiment of soft compliance control implemented by the SMU of FIG. 1.

In other words, there may be several options on how to select the appropriate error and proceed. A first option may include both the compliance and setpoint errors multiplied by their respective GBWs, in which case the resulting $\epsilon*GBW$ value may simply be provided to the integrator, and accumulated accordingly. This is shown in FIG. 5, where the integrator may receive one of $\epsilon_{CH}*GBW_C$, $\epsilon_{CL}*GBW_C$, or $\epsilon_S*GBW_S$, where $GBW_S$ refers to the GBW associated with the setpoint control mode, and $GBW_C$ refers to the GBW associated with the compliance control mode. The selection may be performed by selection element 502. A second option may include the setpoint error being multiplied by the ratio of the GBWs. In that case, one alternative may be to multiply by $GBW_C$ the selected, potentially corrected error, which may be one of $\epsilon_{CH}$, $\epsilon_{CL}$, or $\epsilon_S*GBW_S/GBW_C$, and provide the resulting value to the integrator. This first alternative of the second option is shown in FIG. 6, where the selection is performed by selection element 602. This means the integrator may receive one of $\epsilon_{CH}*GBW_C$, $\epsilon_{CL}*GBW_C$, or $\epsilon_S*GBW_S/GBW_C*GBW_C=\epsilon_S*GBW_S$, as shown in FIG. 6. Another alternative in case of the second option may be to use the corrected setpoint error to determine what appropriate error to use, and provide to the integrator the corresponding original error value (either $\epsilon_{CH}$, $\epsilon_{CL}$, or $\epsilon_S$) multiplied by its corresponding GBW, as illustrated in FIG. 7. In this case, the integrator may receive one of $\epsilon_{CH}*GBW_C$, $\epsilon_{CL}*GBW_C$, or $\epsilon_S*GBW_S$, selected using multiplexer 702, based on the results obtained from the output of selection element 704. While at first glance FIG. 7 may appear somewhat redundant when contrasted with FIGS. 5 and 6, the configuration illustrated in FIG. 7 may allow the word size for the bandwidth ratio to be similar to that of the actual bandwidth, without compromising the resolution available for the selection of the GBW, while minimally impacting the soft compliance behavior.

According to at least diagram 400 in FIG. 4, and the logic diagrams of FIG. 5, FIG. 6, and FIG. 7, a method for applying a control signal to a device for testing the device may include generating a pair of digital values respectively representative of a pair of input signal characteristics of the device, where the pair of input signal characteristics are produced by at least the control signal. The control signal may be adjusted according to whichever produces a more conservative change in a first input signal characteristic of the pair of input signal characteristics: a first control value usable to maintain the first input signal characteristic at a specified setpoint value or a second control value usable to maintain a second input signal characteristic of the pair of input signal characteristics within a specified compliance limit. For example, the pair of input signal characteristics may be an input voltage developed across input terminals of the device, and a current produced in the device by the input voltage.

The first control value may be based on a setpoint error value, which may be generated based on the specified setpoint value, and a first digital value of the pair of digital values that is representative of the first input signal characteristic. The first control value may also be generated based on a modified setpoint error value, which may be obtained by multiplying the setpoint error value by a GBW corresponding to the first input signal characteristic. Similarly, the second control value may be based on a compliance error value, which may be generated based on the specified compliance limit, and a second digital value of the pair of digital values that is representative of the second input signal characteristic. The second control value may also be generated based on a modified compliance error value, which may be obtained by multiplying the compliance error value by a GBW corresponding to the second input signal characteristic.

It should be noted that both the hard compliance method and soft compliance method have their advantages and disadvantages. For example, when operating in hard compliance mode, the compliance limits may oftentimes be exceeded. When operating in soft compliance mode, the response may slow down when nearing a compliance limit, even if that limit is never reached. To avoid the overshoot associated with hard compliance without the speed penalty of soft compliance, any one of a variety of nonlinear mechanisms may be applied as a means of alleviating some of these problems. For example, one compromise between hard compliance and soft compliance methods may include not considering the compliance limits until the SMU is close to reaching the compliance limit, as determined by the relevant measurements, and then switching to soft compliance operating mode. While such nonlinear methods may prove advantageous in certain circumstances, it may be difficult to determine thresholds that work well in most circumstances.

One way to reduce the slowdown associated with soft compliance may be to increase the bandwidth associated with the compliance control loop. It should be noted, however, that doing so may compromise stability of the system once the SMU is operating according to the compliance control loop. However, this may be mitigated somewhat through the use of lead/lag compensators to modify the compliance loop response. Various embodiments of systems and methods of implementing pole-zero compensators in a digital SMU are described in concurrent U.S. patent application Ser. No. 13/154,237, which is hereby incorporated in its entirety as though fully and completely set forth herein.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A source-measure unit (SMU) comprising:
   output terminals configured to couple the SMU to a device, and further configured to convey an analog output signal to the device, to effect:
      an output current flowing into the device; and
      an output voltage across input terminals of the device; and
   a digital loop controller configured to:
      receive a first digital value representative of the output current and a second digital value representative of the output voltage;
      selectively regulate for one of the output voltage and the output current;
      when selected to regulate for the output current:
         adjust the analog output signal according to the first digital value to keep the output current at a specified current setpoint, until the output voltage reaches a specified voltage compliance limit; and
         adjust the analog output signal according to the second digital value to keep the output voltage from moving past the specified voltage compliance limit once the output voltage reaches the specified voltage compliance limit;
      when selected to regulate for the output voltage:
         adjust the analog output signal according to the second digital value to keep the output voltage at a specified voltage setpoint, until the output current reaches a specified current compliance limit; and
         adjust the analog output signal according to the first digital value to keep the output current from moving past the specified current compliance limit once the output current reaches the specified current compliance limit.

2. The SMU of claim 1, further comprising:
   a first converter configured to generate the first digital value; and
   a second converter configured to generate a second digital value.

3. The SMU of claim 1, wherein the digital loop controller is further configured to:
   generate one or more respective error values based on the first digital value, the second digital value, the specified current setpoint, the specified voltage setpoint, the specified current compliance limit and the specified voltage compliance limit;
   perform an integration function to produce a digital control value, wherein the integration function is configured to receive the one or more respective error values as input; and
   adjust the analog output signal according to the digital control value.

4. The SMU of claim 1, wherein the digital loop controller is further configured to:
   generate an error value based on the first digital value and the specified current setpoint; and
   adjust the analog output signal according to the error value when selected to regulate for the output current, and the output voltage has not reached the specified voltage compliance limit.

5. The SMU of claim 1, wherein the specified current compliance limit comprises a high current limit and a low current limit;
   wherein the digital loop controller is further configured to perform one or more of:
      generate a first error value based on the first digital value and the high current limit, and adjust the analog output signal according to the first error value when selected to regulate for the output voltage, and the output current has reached the high current limit; and
      generate a second error value based on the first digital value and the low current limit, and adjust the analog output signal according to the second error value when selected to regulate for the output voltage, and the output current has reached the low current limit.

6. The SMU of claim 1, wherein the digital loop controller is further configured to:
   generate an error value based on the second digital value and the specified voltage setpoint; and
   adjust the analog output signal according to the error value when selected to regulate for the output voltage, and the output current has not reached the specified current compliance limit.

7. The SMU of claim 1, wherein the specified voltage compliance limit comprises a high voltage limit and a low voltage limit;

wherein the digital loop controller is further configured to perform one or more of:
  generate a first error value based on the second digital value and the high voltage limit, and adjust the analog output signal according to the first error value when selected to regulate for the output current, and the output voltage has reached the high voltage limit; and
  generate a second error value based on the second digital value and the low voltage limit, and adjust the analog output signal according to the second error value when selected to regulate for the output current, and the output voltage has reached the low voltage limit.

8. The SMU of claim 1, wherein the digital loop controller is further configured to:
  when selected to regulate for the output current:
    adjust the analog output signal according to the first digital value to keep the output current at the specified current setpoint whenever the output current moves past the specified current setpoint; and
  when selected to regulate for the output voltage:
    adjust the analog output signal according to the second digital value to keep the output voltage at the specified voltage setpoint whenever the output voltage moves past the specified voltage setpoint.

9. A digital loop controller comprising:
  a first input configured to receive a first digital value representative of an output current developed across input terminals of a device; and
  a second input configured to receive a second digital value representative of an output voltage effected in the device by the output voltage;
  wherein the digital loop controller is configured to generate a digital control value to adjust the output voltage to selectively regulate for one of the output voltage and the output current;
  wherein when regulating for the output voltage, the digital loop controller is configured to:
    generate the digital control value according to the second digital value to keep the output voltage at a specified voltage setpoint, until the output current reaches a specified current compliance limit; and
    generate the digital control value according to the first digital value to keep the output current from moving past the specified current compliance limit once the output current reaches the specified current compliance limit;
  wherein when regulating for the output current, the digital loop controller is configured to:
    generate the digital control value according to the first digital value to keep the output current at a specified current setpoint, until the output voltage reaches a specified voltage compliance limit; and
    generate the digital control value according to the second digital value to keep the output voltage from moving past the specified voltage compliance limit once the output voltage reaches the specified voltage compliance limit.

10. The digital loop controller of claim 9, further configured to:
  generate one or more respective error values based on the first digital value, the second digital value, the specified current setpoint, the specified voltage setpoint, the specified current compliance limit and the specified voltage compliance limit; and
  perform an integration function to produce the digital control value, wherein the integration function is configured to receive the one or more respective error values as input.

11. The digital loop controller of claim 9, further configured to:
  generate an error value based on the first digital value and the specified current setpoint; and
  generate the digital control value according to the error value when regulating for the output current, and the output voltage has not reached the specified voltage compliance limit.

12. The digital loop controller of claim 9, wherein the specified current compliance limit comprises a high current limit and a low current limit;
  wherein the digital loop controller is further configured to perform one or more of:
    generate a first error value based on the first digital value and the high current limit, and generate the digital control value according to the first error value when regulating for the output voltage, and the output current has reached the high current limit; and
    generate a second error value based on the first digital value and the low current limit, and the digital control value according to the second error value when regulating for the output voltage, and the output current has reached the low current limit.

13. The digital loop controller of claim 9, further configured to:
  generate an error value based on the second digital value and the specified voltage setpoint; and
  generate the digital control value according to the error value when regulating for the output voltage, and the output current has not reached the specified current compliance limit.

14. The digital loop controller of claim 9, wherein the specified voltage compliance limit comprises a high voltage limit and a low voltage limit;
  wherein the digital loop controller is further configured to perform one or more of:
    generate a first error value based on the second digital value and the positive voltage limit, and generate the digital control value according to the first error value when regulating for the output current, and the output voltage has reached the low voltage limit; and
    generate a second error value based on the second digital value and the low voltage limit, and generate the digital control value according to the second error value when regulating for the output current, and the output voltage has reached the low voltage limit.

15. A method for applying a control signal to a device for testing the device, the method comprising:
  generating a pair of digital values respectively representative of a pair of input signal characteristics of the device, wherein the pair of input signal characteristics are produced by at least the control signal;
  adjusting the control signal according to whichever of the following produces a more conservative change in a first input signal characteristic of the pair of input signal characteristics:
    a first control value usable to maintain the first input signal characteristic at a specified setpoint value; and
    a second control value usable to maintain a second input signal characteristic of the pair of input signal characteristics within a specified compliance limit.

16. The method of claim 15, further comprising:
  generating a setpoint error value based on:

a first digital value of the pair of digital values representative of the first input signal characteristic; and
the specified setpoint value; and
generating the first control value based on the setpoint error value.

17. The method of claim 16, further comprising:
multiplying the setpoint error value by a gain bandwidth product (GBW) corresponding to the first input signal characteristic, to obtain a modified setpoint error value; and
generating the first control value based on the modified setpoint error value.

18. The method of claim 15, further comprising:
generating a compliance error value based on:
a second digital value of the pair of digital values representative of the second input signal characteristic; and
the specified compliance limit; and
generating the second control value based on the compliance error value.

19. The method of claim 18, further comprising:
multiplying the compliance error value by a gain bandwidth product (GBW) corresponding to the second input signal characteristic, to obtain a modified compliance error value; and
generating the second control value based on the modified compliance error value.

20. The method of claim 15, wherein the pair of input signal characteristics comprise:
an input voltage across input terminals of the device; and
a current produced in the device by the input voltage.

21. The method of claim 15, wherein the specified compliance limit is a low compliance limit, and wherein the second control value is usable to prevent the second input signal characteristic from falling below the specified compliance limit.

22. The method of claim 15, wherein the specified compliance limit is a high compliance limit, and wherein the second control value is usable to prevent the second input signal characteristic from exceeding the specified compliance limit.

23. A method for applying a control signal to a device for testing the device, the method comprising:
generating a pair of digital values respectively representative of a pair of input signal characteristics of the device, wherein the pair of input signal characteristics are produced by at least the control signal;
adjusting the control signal according to whichever one of the following produces a more conservative change in a first input signal characteristic of the pair of input signal characteristics:
a first control value usable to maintain the first input signal characteristic at a specified setpoint value;
a second control value usable to maintain a second input signal characteristic of the pair of input signal characteristics at or below a specified high compliance limit; and
a third control value usable to maintain the second input signal characteristic of the pair of input signal characteristics at or above a specified low compliance limit.

* * * * *